United States Patent
Tu et al.

(10) Patent No.: US 6,627,983 B2
(45) Date of Patent: Sep. 30, 2003

(54) STACKED PACKAGE STRUCTURE OF IMAGE SENSOR

(76) Inventors: Hsiu Wen Tu, No. 84, Taiho Road, Chuupei, Hsinchu Hsien (TW); Wen Chuan Chen, No. 84, Taiho Road, Chupei, Hsinchu Hsien (TW); Mon Nan Ho, No. 84, Taiho Road, Chupei, Hsinchu Hsien (TW); Li Huan Chen, No. 84, Taiho Road, Chupei, Hsinchu Hsien (TW); Nai Hua Yeh, No. 84, Taiho Road, Chupei, Hsinchu Hsien (TW); Yen Cheng Huang, No. 84, Taiho Road, Chupei, Hsinchu Hsien (TW); Yung Sheng Chiu, No. 84, Taiho Road, Chupei, Hsinchu Hsien (TW); Jichen Wu, No. 84, Taiho Road, Chupei, Hsinchu Hsien (TW); Joe Liu, No. 84, Taiho Road, Chupei, Hsinchu Hsien (TW); Wu Hsiang Lee, No. 84, Taiho Road, Chupei, Hsinchu Hsien (TW)

( * ) Notice: Subject to any disclaimer, the term of this patent is extended or adjusted under 35 U.S.C. 154(b) by 0 days.

(21) Appl. No.: 09/770,083

(22) Filed: Jan. 24, 2001

(65) Prior Publication Data

US 2002/0096753 A1 Jul. 25, 2002

(51) Int. Cl.[7] .............................................. H01L 23/02
(52) U.S. Cl. ........................ 257/680; 257/432; 257/434; 257/723; 257/777; 257/778
(58) Field of Search ................................. 257/680, 723, 257/777, 778, 432–434

(56) References Cited

U.S. PATENT DOCUMENTS

| | | | | |
|---|---|---|---|---|
| 5,729,038 A | * | 3/1998 | Young et al. | 257/460 |
| 5,869,896 A | * | 2/1999 | Baker et al. | 257/724 |
| 6,300,674 B1 | * | 10/2001 | Wang | 257/666 |

FOREIGN PATENT DOCUMENTS

EP 0526776 A1 * 2/1993 ......... H01L/31/167

* cited by examiner

Primary Examiner—Eddie Lee
Assistant Examiner—Matthew E. Warren
(74) Attorney, Agent, or Firm—Pro-Techtor International Services

(57) ABSTRACT

A stacked package structure of an image sensor for electrically connecting to a printed circuit board includes a first substrate, a second substrate, an integrated circuit, an image sensing chip, and a transparent layer. The second substrate is mounted on the first substrate so as to a cavity formed between the first substrate and second substrate. The integrated circuit is located within the cavity and electrically connected the first substrate. The image-sensing chip is arranged on the second substrate. The transparent layer covers over the image sensing chip, wherein the image sensing chip receives image signals via the transparent layer and transforms the image signals into electrical signals transmitted to the first substrate. Thus, the image sensing chip of the image sensing product and the integrated circuit can be integrally package.

12 Claims, 1 Drawing Sheet

STACKED PACKAGE STRUCTURE OF IMAGE SENSOR

BACKGROUND OF THE INVENTION

1. Field of the Invention

The present invention relates to a stacked package structure of an image sensor, in particular, to a structure in which integrated circuit and image sensing chip, both having different function, are packaged into a package body so as to reduce the number of the package substrates and to integrally package the integrated circuited and image sensing chip both having different functions.

2. Description of the Art

A general sensor is used for sensing signals, which may be optical or audio signals. The sensor of the present invention is used for receiving images and transforming the image signals into electrical signal to be transmitted to a printed circuit board.

A general sensor is used for receiving image signals and converting the image signals into electrical signals that are transmitted to a printed circuit board. The image sensor is then electrically connected to other integrated circuit to have any required functions. For example, the image sensor may be electrically connected to a digital signal processor that processes the signals generated from the image sensor. Further, the image sensor may also be electrically connected to a micro controller, a central processor, or the like, so as to have any required function.

However, since the conventional image sensor is packaged, the integrated circuits corresponding to the image sensor have to be individually packaged with the image sensor. Then, the packaged image sensor and various signal processing units are electrically connected onto the printed circuit board.

Thereafter, the image sensor is electrically connected to the signal processing units by a plurality of wirings, respectively, therefore, in order to individually package each of the signal processing units and the image sensor, a plurality of substrates and package bodied have to be used, thereby increasing the manufacturing costs. Furthermore, the required area of the printed circuit board should be large when mounting each of the processing units onto the printed circuit board, so the products cannot be made small, thin, and light.

In order to solve the above-mention problems, the present invention provides a stacked structure of an image sensor to overcome the disadvantages caused by conventional sensor.

SUMMARY OF THE PRESENT INVENTION

It is therefore an object of the present invention to provide a stacked package structure of an image sensor for reducing the number of the package elements and lowering the package costs.

It is therefore another object of the present invention to provide a stacked package structure of an image sensor for simplifying and facilitating the manufacturing processes.

It is therefor still object of the present invention to provide a stacked package structure of an image sensor for lowering the area of the image sensor.

It is therefor yet object of the present invention to provide a stacked package structure of an image sensor for lowering the package costs and testing costs of the image sensing products.

According to one aspect of the present invention, a stacked package structure of an image sensor for electrically connecting to a printed circuit board comprises a first substrate, a second substrate, an integrated circuit, an image sensing chip, and a transparent layer. The first substrate has a first surface and a second surface opposite to the first surface. The first surface of the first substrate is formed with signal input terminals. The second surface of the first substrate is formed with signal output terminals for electrically connecting to the printed circuit board. The second substrate has a upper surface and a lower surface opposite to the upper surface. The lower surface of the second substrate is adhered to the first surface of the first substrate, so that a cavity is formed between the first substrate and second substrate. The integrated circuit is mounted on the first surface of the first substrate and located within the cavity, and the integrated circuits electrically connected to the signal input terminals on the first surface of the substrate. The image sensing chip is arranged on the upper surface of the second substrate. The transparent layer covers over the image sensing chip, wherein the image sensing chip receives image signals via the transparent layer and transforms the image signals into electrical signals transmitted to the first substrate.

Thus, the image sensing chip of the image sensing product and the integrated circuit can be integrally package.

DETAIL DESCRIPTION OF THE PRESENT INVENTION

The embodiment of the present invention will now be described reference to the drawings.

Figure 1:
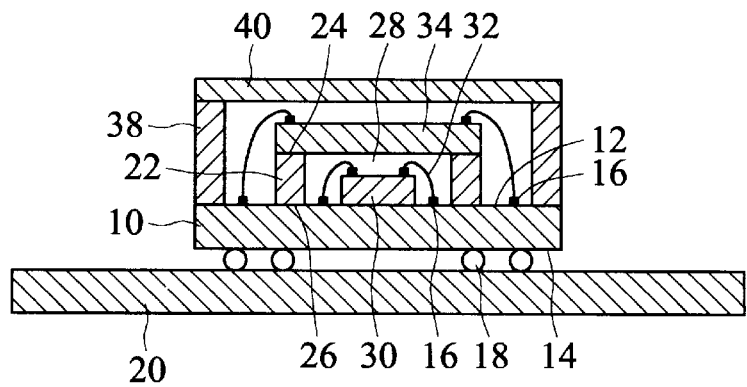
FIG. 1 is a schematic illustration showing a stacked package structure of an image sensor according to a first embodiment of the present invention.

As shown in FIG. 1, the stacked package structure of an image sensor of the present invention includes a first substrate 10, a second substrate 22, an integrated circuit 30, an image sensing chip 34, a projecting structure 38 and a transparent layer 40.

The first substrate 10 has a first surface 12 and a second surface 14 opposite to the first surface 12. The first surface 12 of the first substrate 10 is formed with signal input terminals 16. The second surface 14 of the first substrate 10 is formed with signal output terminals 18, which may be metallic balls arranged in the form of ball grid array, for transmitting signals from the first substrate 10 to the printed circuit board 20.

The second substrate 22 has an upper surface 24 and a lower surface 26 opposite to the upper surface 24. The lower surface 26 of the second substrate 22 is adhered to the first surface 12 of the first substrate 10, so that a cavity 28 is defined by the first substrate 10 and second substrate 22.

The integrated circuit 30 may be a signals processing unit such as a digital signal processor, a micro-processor, a central processing unit (CPU), or the like. The integrated circuit 20 is arranged on the first surface 12 of the first substrate 10 and is located within the cavity 28. The integrated circuit 30 is electrically connected to the signal input terminals 16 formed on the first surface 12 of the first substrate 10 via a plurality of wirings 32 by way of wire bond. So that the integrated circuit 30 is electrically connected to the first substrate 10. If the integrated circuit 30 is a digital signal processor, the signals from the image sensing chip 34 can be processed in advance and then transmitted to the printed circuit board 20.

The image sensing chip 34 is arranged on the upper surface 24 of the second substrate 22 and electrically connected to the signal input terminals 16 formed on the first surface 12 of the first substrate 10. Thus, signal from the image sensing chip 34 can be transmitted to the first substrate 10.

The projecting structure 38 is a frame mounted on the first surface 12 of the first substrate 10 for surrounding the integrated circuit 30 and image sensing chip 34.

The transparent layer 40 may be a transparent glass, which is covering the projecting structure 38 for sealing the integrated circuit 30 and image sensing chip 34. The image sensing chip 34 is capable of receiving image signal via the transparent layer 40 and converting the image signals into electrical signals that are to be transmitted to the first substrate 10.

Figure 2:
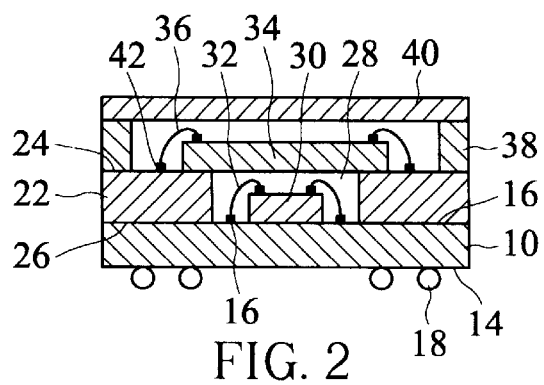
FIG. 2 is a schematic illustration showing a stacked package structure of an image sensor according to a second embodiment of the present invention.

Referring to FIG. 2 is a schematic illustration showing a stacked package structure of an image sensor according to a second embodiment of the present invention. The upper surface 24 of the second substrate 22 is formed with signal input terminals 42. The lower surface 26 of the second substrate 22 is mounted to the first surface 12 of the first substrate 10. Thus, a cavity 28 is defined by the first substrate 10 and second substrate 22. The integrated circuit 30 is arranged on the first surface 12 and is located within the cavity 28. Then, the integrated circuit 30 being electrically connected to the signal input terminals 42 formed on the first surface 12 of the first substrate 10 via wirings 32 by way of wire bonding.

The image sensing chip 34 is arranged on the upper surface 24 of the substrate 22, which is electrically connected to the signal input terminals 42 formed on the upper surface 24 of the second substrate 22.

The projecting structure 38 is mounted on the first surface 12 of the first substrate 10 for surrounding the integrated circuit 30 and image sensing chip 34.

The transparent layer 40 may be a transparent glass, which is located on the projecting structure 38 for sealing the integrated circuit 30 and image sensing chip 34. The image sensing chip 34 is capable of receiving image signals via the transparent layer 40 and converting the image signals into electrical signals to be transmitted to the first substrate 10.

Figure 3:
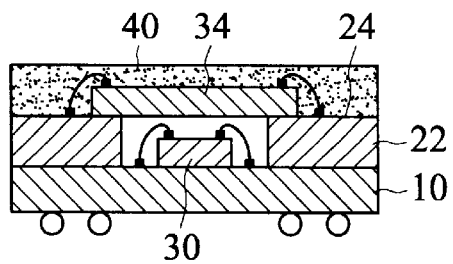
FIG. 3 is a schematic illustration showing a stacked package structure of an image sensor according to a third embodiment of the present invention.

Referring to FIG. 3, the transparent layer 40 may be a transparent glue, covering over the upper surface 24 of the second substrate 22. Therefore, the integrated circuit 30 and image sensing chip 34 are sealed by the transparent layer 40. Then, the image sensing chip 34 can receive image signals via the transparent layer 40 and can transform the image signals into electrical signals to be transmitted to the first substrate 22.

Figure 4:
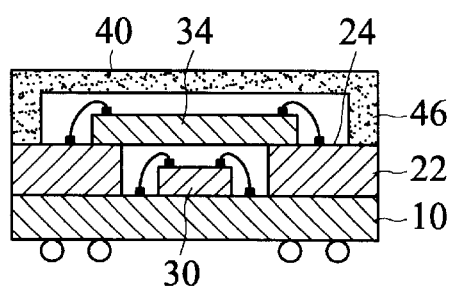
FIG. 4 is a schematic illustration showing a stacked package structure of an image sensor according to a third embodiment of the present invention.

Referring to FIG. 4, the transparent layer 40 is made of transparent glue, which has "⊓ -shaped" cross section and a supporting column 46 for mounting to the upper surface 24 of the second substrate 22. The "⊓ shaped" transparent layer 40 can be formed by injecting or press molding. Thus, the image sensing chip 34 and integrated circuit 30 are covered by the transparent layer 40, a image signals can be received by the image sensing chip 34 via the transparent 40.

According to the above-mention structure, the following advantages can be obtained.

1. Since the image sensing chip 34 and integrated circuit 30 can be integrally package, the material forming the substrate 10 can be reduced, thereby lowering the manufacturing costs of the image sensing products.
2. Since the image sensing chip 34 and integrated circuit 30 can be integrally package, the area of the image sensing products can be reduced.
3. Since the image sensing chip 34 and integrated circuit 30 can be integrally package, there is only one package body. Thus, one testing fixture needs be used, and the testing costs can also be reduced.
4. Since the image sensing chip 34 and integrated circuit 30 can be integrally packaged, two chips can be package by only one packaging process. The package costs can thus be effectively lowered.

While the present invention has been described by way of example and in terms of preferred embodiments, it is to be understood that the present invention is not limited to the disclosed embodiments. Therefore, the scope of the appended claims should be accorded the broadest interpretation so as to encompass all such modifications.

What is claimed is:

1. A stacked package structure of an image sensor used for electrically connecting to a printed circuit board, the package structure comprising:

a first substrate having a first surface and a second surface opposite to the first surface, the first surface being formed with signal input terminals, and the second surface being formed with signal output terminals for electrically connecting to the printed circuit board;

a second substrate having an upper surface and a lower surface opposite to the upper surface, the lower surface of the second substrate being adhered to the first surface of the first substrate so as to define a cavity by the first substrate and second substrate;

an integrated circuit mounted on the first surface of the first substrate and located within the cavity, and the integrated circuit being electrically connected to the signal input terminals on the first surface of the first substrate;

an image sensing chip arranged on the upper surface of the second substrate, and electrically connected to the first substrate; and a transparent layer covering over the image sensing chip, wherein the image sensing chip receives image signals via the transparent layer and transforms the image signals into electrical signals transmitted to the first substrate.

2. The stacked package structure of an image sensor according to claim 1, wherein the signal output terminals on the second surface of the first substrate are metallic balls arranged in the form of ball grid array for electrically connecting to the printed circuit board.

3. The stacked package structure of an image sensor according to claim 1, wherein the upper surface of the second substrate is formed with signal input terminals, which are electrically connected to the image sensing chip.

4. The stacked package structure of an image sensor according to claim 1, wherein the image sensing chip is electrically connected to the signal input terminals on the first surface of the first substrate.

5. The stacked package structure of an image sensor according to claim 1, wherein the integrated circuit is a signal processing unit.

6. The stacked package structure of an image sensor according to claim 5, wherein the signal processing unit is a digital signal processor for processing signals from the image sensing chip.

7. The stacked package structure of an image sensor according to claim 5, wherein the signal processing unit is a micro-controller.

8. The stacked package structure of an image sensor according to claim 5, wherein the signal processing unit is a central processing unit (CPU).

9. The stacked package structure of an image sensor according to claim 1, wherein the transparent layer is a transparent glass.

10. The stacked package structure of an image sensor according to claim 1, wherein a projecting structure is arranged on the periphery of the upper surface of the second substrate, and the transparent layer is located on the projecting structure.

11. The stacked package structure of an image sensor according to claim 1, wherein the transparent layer is made of transparent glue.

12. The stacked package structure of an image sensor according to claim 11, wherein the transparent glue has a "⊓-shaped" cross section and a supporting column mounted to the upper surface of the second substrate.

* * * * *